(12) United States Patent
Moriya et al.

(10) Patent No.: US 8,202,394 B2
(45) Date of Patent: Jun. 19, 2012

(54) METHOD OF MANUFACTURING SEMICONDUCTOR DEVICES AND SEMICONDUCTOR MANUFACTURING APPARATUS

(75) Inventors: Tsuyoshi Moriya, Tokyo (JP); Natsuko Ito, Tokyo (JP); Fumihiko Uesugi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 1933 days.

(21) Appl. No.: 10/166,303

(22) Filed: Jun. 11, 2002

(65) Prior Publication Data

US 2003/0003758 A1    Jan. 2, 2003

(30) Foreign Application Priority Data

Jun. 11, 2001 (JP) .................................. 2001-176358
Apr. 19, 2002 (JP) .................................. 2002-117512

(51) Int. Cl.
*H01L 21/3065* (2006.01)

(52) U.S. Cl. .................................................. 156/345.47

(58) Field of Classification Search ............ 315/111.21; 118/723 E; 156/345.43, 345.44, 345.45, 156/345.46, 345.47; 438/710; 216/67; 134/1.1
See application file for complete search history.

(56) References Cited

U.S. PATENT DOCUMENTS

| | | | |
|---|---|---|---|
| 5,210,466 A * | 5/1993 | Collins et al. ............ 315/111.21 |
| 5,531,862 A * | 7/1996 | Otsubo et al. .................. 438/798 |
| 5,573,597 A | 11/1996 | Lantsman | |
| 5,728,278 A * | 3/1998 | Okamura et al. ........ 204/298.11 |
| 6,167,835 B1 * | 1/2001 | Ootera et al. ............. 118/723 E |
| 6,184,489 B1 * | 2/2001 | Ito et al. .................... 219/121.43 |
| 6,192,828 B1 * | 2/2001 | Takahashi et al. ........ 118/723 E |
| 6,196,155 B1 * | 3/2001 | Setoyama et al. .... 118/723 MA |

FOREIGN PATENT DOCUMENTS

| | | | |
|---|---|---|---|
| JP | 63176475 A * | 7/1988 |
| JP | 05-217964 | 8/1993 |
| JP | 05217964 A * | 8/1993 |
| JP | 06-318552 | 11/1994 |
| JP | 7-249614 | 9/1995 |
| JP | 09-312278 | 12/1997 |
| JP | 11-145112 | 5/1999 |
| JP | 11-176806 | 7/1999 |
| JP | 11-297678 | 10/1999 |
| JP | 11293468 A * | 10/1999 |
| JP | 2000003902 A * | 1/2000 |
| JP | 2002-270582 | 9/2002 |
| WO | WO 00/67306 | 11/2000 |

* cited by examiner

*Primary Examiner* — Ram Kackar
*Assistant Examiner* — Anna Crowell
(74) *Attorney, Agent, or Firm* — Young & Thompson

(57) ABSTRACT

In a method of manufacturing a semiconductor device with plasma generated in a process chamber by impressing radio-frequency power, a level of a radio-frequency power for each step is switched over in response to processing in each step upon applying a plurality of processing steps to a semiconductor substrate while holding the semiconductor substrate, and thereby the plurality of steps are carried out successively.

13 Claims, 12 Drawing Sheets

METHOD OF MANUFACTURING SEMICONDUCTOR DEVICES AND SEMICONDUCTOR MANUFACTURING APPARATUS

BACKGROUND OF THE INVENTION

The present invention relates to a method of manufacturing semiconductor devices and a semiconductor manufacturing apparatus. More particularly, the invention relates to a manufacturing method of semiconductor devices and a semiconductor manufacturing apparatus which reduce the effect of particles (foreign matter particles) produced upon processing when manufacturing semiconductor devices by applying a plurality of steps of processing by means of plasma.

When manufacturing semiconductor devices typically represented by an LSI (large-scale integrated circuit) such as a microprocessor or a memory, it is necessary to conduct a plurality of processing steps including a step of forming thin films comprising various insulating films and a conductive film on a semiconductor substrate and a step of processing the thus formed thin films or the semiconductor substrate itself. When performing these processing steps, it is the present practice to use a plurality of semiconductor manufacturing apparatuses including a plasma etcher, a plasma CVD (chemical vapor deposition) apparatus and a plasma sputtering apparatus using the plasma technology.

In the step of processing a thin film formed on the semiconductor substrate into a desired shape, for example, the semiconductor substrate is transferred into a process chamber of a plasma etcher in such a state that a necessary area of the thin film is masked by a resist film for conducting plasma etching. A lower electrode which mounts the semiconductor substrate and an upper electrode arranged oppositely thereto are provided in the process chamber, and an etching gas is introduced into the process chamber. The etching gas is converted into plasma through generation of discharge in the process chamber by impressing a radio-frequency voltage onto the lower electrode to etch the portion not masked by a resist.

As is clear from FIG. 1, impression of radio-frequency power having a power P1 is started at time t1. After keeping power P1 for a certain period of time, impression of radio-frequency power is discontinued at time t2. The extent of generation of plasma is governed substantially by the radio-frequency power. In order to actually generate plasma, other conditions such as the amount of introduced plasma generating gas, the inner pressure in the process chamber and the like may also be taken into account.

When plasma-etching the thin film by use of the plasma etcher as described above, reaction products and the like are deposited in the process chamber. These deposits peel off, and adhere to the semiconductor substrate as particles, thereby contaminating the substrate. These stripped particles are produced similarly when applying processing by use of any of various plasma generators. For example, particles are produced as upon etching also when applying a plasma CVD processing by transferring the semiconductor substrate into the plasma CVD apparatus or when applying plasma sputtering by transferring the semiconductor substrate into a plasma sputtering apparatus. In these processing steps, each time the semiconductor substrate is transferred to each plasma generator, processing the details of which are shown in FIG. 1 is repeated. This causes a further increase in the number of produced particles. Therefore, when manufacturing semiconductor devices through repetition of various steps of processing yield decreases under the effect of particles.

When manufacturing semiconductor devices through a plurality of processing steps by use of plasma, therefore, it is conventionally conceived to accomplish manufacture through a plurality of successive steps while holding semiconductor substrates in process chambers of a common plasma generator, by switching over the extent of radio-frequency power from time to time in response to the individual processing steps.

As illustrated in FIG. 2, in such a manufacturing method of semiconductor devices, a plurality of processes are carried out through a plurality of successive steps of conducting a process A by impressing a radio-frequency power of a power P1 onto the lower electrode during the period from time t1 to time t2; conducting a process B by impressing a radio-frequency power of a power P3 during the period from time t3 to time t4; conducting a process C by impressing a radio-frequency power of a power P2 during the period from time t5 to time t6; and conducting a process D by impressing a radio-frequency power of a power P4 during the period from time t7 to time t8.

In the existing manufacturing method of semiconductor devices, when conducting the method through a plurality of processes by means of plasma in a plurality of successive steps, a radio-frequency power is repeatedly started up and impressed for each step. This poses a problem of difficulty to reduce the effect of particles.

More specifically, in the existing manufacturing method of semiconductor devices, when conducting the plurality of processes through a plurality of successive steps, the radio-frequency power is repeatedly turned on and off for each of the steps. This results in stoppage of discharging each time. Because particles stripped off from the component parts of the process chamber are positively charged, the particles are confined in a sheath near the upper electrode or near the process chamber during plasma discharge. Upon stoppage of discharge and disappearance of plasma, the particles are attracted by the substrate having a negative self-bias potential, and adhere thereto. The particles dropping on the substrate during an interval between two steps may form defects through the next step.

Repetition of a steep change in radio-frequency power from 0 to a high power or from a high power to 0 for every step causes application of stress onto the film of reaction products adhering in the process chamber, and breakage and stripping of this film causes easier production of particles. Particularly, particles produced in the proximity of the semiconductor substrate are attracted by the negative self-bias potential of the semiconductor substrate even during discharge, and adhere thereto. The particles adhered to the semiconductor substrate in the middle of a step may form defects during the current or next step processing.

SUMMARY OF THE INVENTION

It is therefore an object of this invention to provide a manufacturing method of semiconductor devices and a semiconductor manufacturing apparatus which, when conducting a plurality of processes through a plurality of steps by use of plasma, inhibits production of particles adhering to the semiconductor substrate, and prevent the number of particles, even if produced, from increasing, so as to reduce the adverse effect of the particles.

To solve the above-mentioned problems, a first aspect of the present invention provides a manufacturing method of semiconductor devices, comprising the steps of using a plasma generator having a cathode which mounts a semiconductor substrate to be processed and an anode arranged oppositely to said cathode in a process chamber, introducing a process gas into said process chamber, and generating plasma in the process chamber by impressing radio-frequency power onto said cathode, thereby applying a desired processing to the semiconductor substrate; wherein, when applying a plurality of processing steps to the semiconductor substrate while holding the semiconductor substrate, switching over the level of radio-frequency power for each step in response to the processing in each step to carry out the plurality of runs of processing in a plurality of steps in succession.

In the first aspect of the invention, the kind of the process gas is preferably switched aver for each run of the plurality of processing steps.

Preferably, fluoride is not used as the process gas.

Preferably, the process gas is selected from the group consisting of helium, neon, argon, krypton, radon, oxygen and nitrogen.

In the method, an auxiliary step having an intermediate value of power level between power levels of two adjacent steps may be inserted between these two adjacent steps from among the plurality of steps.

In the method, an auxiliary step of which the power level slowly changes between power levels of two adjacent steps may be inserted between these two adjacent steps from among the plurality of steps.

In the method; an auxiliary step of which the power level slowly increases between 0 and the power level of the first step may be placed before the first step of the plurality of steps.

In the method, an auxiliary step of which the power level increases over the power level of the final step may be placed after the final step of the plurality of steps.

A second aspect of the invention provides a semiconductor manufacturing apparatus, having a configuration in which a cathode mounting a semiconductor substrate to be processed and an anode electrode opposite thereto are arranged in a process chamber, and the semiconductor substrate is subjected to a desired processing by introducing a process gas into the process chamber, and generating plasma in the process chamber through impression of a radio-frequency power onto the cathode, further comprising radio-frequency power control means which impresses a radio-frequency power onto the cathode by switching over the level of radio-frequency power for each run of processing in response to each of a plurality of runs of processing while holding the semiconductor substrate in the process chamber.

Potential difference imparting means may be provided between the process chamber and a bulk plasma formed in the process chamber, the potential difference imparting means imparting a potential difference to such an extent as to prevent the particles present in the process chamber from adhering to the semiconductor substrate.

Preferably, the potential difference imparting means comprises a negative power supply which gives a negative potential to the process chamber.

A third aspect of the invention provides a semiconductor manufacturing apparatus having a configuration in which a cathode mounting a semiconductor substrate to be processed and an anode opposite thereto are arranged in a process chamber, and the semiconductor substrate is subjected to a desired processing by introducing a process gas into the process chamber, and generating plasma in the process chamber through impression of a radio-frequency power onto the cathode, wherein at least some of the component part used in the semiconductor manufacturing apparatus are made of a material having a dielectric constant close to that of reaction products accumulated in the process chamber.

A fourth aspect of the invention provides a semiconductor manufacturing apparatus having a configuration in which a cathode mounting a semiconductor substrate to be processed and an anode opposite thereto are arranged in a process chamber, and the semiconductor substrate is subjected to a desired processing by introducing a process gas into the process chamber, and generating plasma in the process chamber through impression of a radio-frequency power onto the cathode, wherein at least some of the component parts used in the semiconductor manufacturing apparatus are made of a material having an elastic modulus close to that of reaction products accumulated in the process chamber.

A fifth aspect of the invention provides a semiconductor manufacturing apparatus having a configuration in which a cathode mounting a semiconductor substrate to be processed and an anode opposite thereto are arranged in a process chamber, and the semiconductor substrate is subjected to a desired processing by introducing a process gas into the process chamber, and generating plasma in the process chamber through impression of a radio-frequency power onto the cathode, wherein at least some of the component parts used in the semiconductor manufacturing apparatus are made of a material having a dielectric constant and an elastic modulus close to those of reaction products accumulated in the process chamber.

A result of observation having served as a starting point for the successful completion of the present invention will now be described.

The present invention has obtained the following result of observation by observing production of particles in a process chamber of a plasma etcher, a kind of semiconductor manufacturing apparatus and the behavior of the thus produced particles.

As shown in FIG. 14, the particle monitoring system 30 has a configuration, in which the behavior of particles is observed by the laser beam scattering method by irradiating a laser beam to a process chamber 28 of a plasma etcher (semiconductor manufacturing apparatus) 27 having the process chamber 28 for applying an etching treatment to the semiconductor substrate, and a transfer chamber 29 for transferring the semiconductor substrate into the process chamber 28.

The particle monitoring system 30 comprises a laser source 31, an optical system 32 which irradiates a laser beam from the laser source 31 to the process chamber 28, a CCD camera 33 which picks up an image of the interior of the process chamber 28, a semiconductor manufacturing apparatus (a plasma etcher in this example) control panel 34 which sets various observing conditions, a signal processor 35 which processes various signals from the semiconductor manufacturing apparatus 34, and a computer 36 which controls the entire system.

As shown in FIG. 15, various signals from among parameters such as radio-frequency power (RF power) for processing, chamber inner pressure (Pressure), processing gas (for example, sulfur hexafluoride ($SF_6$) flow rate (Flow Rate), opening of a gate valve for transferring the semiconductor substrate (Insulation Valve), helium gas flow rate (He Flow Rate), electrostatic chucking voltage (ESC Voltage), electrostatic chucking current (ESC Current), and stage-up-position (Stage Up) are entered into the computer 36 via the signal processor 35. The number of particles in the process chamber 28 is measured by detecting the laser beam scattered in the process chamber 28 with the CCD camera 33.

In FIG. 15, the mark ● represent a particle produced in the process chamber upon etching. Many particles are produced at a point in time of impressing a radio-frequency power and immediately after starting (25-40 seconds thereafter). Many particles are produced also immediately after discontinuing impression of radio-frequency current and discontinuing etching (103 to 105 seconds thereafter).

Particles produced as if they jumped up from the periphery of the semiconductor sub-strate (wafer) are observed in FIG. 16. These particles are conjectured to be produced through peeling of a thin film comprising an insulating film or a conductive film accumulating on component parts in the chamber to which stress is applied. As is clear from FIG. 16, the particles produced on the periphery of the semiconductor substrate were confirmed to come flying onto the semiconductor substrate describing a parabola and adhere thereto. This motion of the particles is attributable to the action of electrostatic force. This will now be described.

In a semiconductor manufacturing apparatus using plasma, it is the common practice to adopt a configuration in which a grounded upper electrode is used as an anode and the lower electrode onto which radio-frequency voltage is impressed serves as a cathode. Ceramic rings which are insulators are arranged around the semiconductor substrate so that production of plasma is limited within the upper portion of the semiconductor substrate.

Referring to FIG. 12, the grounded upper electrode 39 has a potential of 0, and the lower electrode 40 to which the radio-frequency power source 11 has a negative potential. Plasma is generated in a space between the upper electrode 39 and the lower electrode 40, and this plasma region shows a positive potential. In a typical semiconductor manufacturing apparatus, sheath areas in which potential steeply changes exist near the upper electrode 39 and the lower electrode 40.

While processing of the semiconductor substrate is repeated by use of the above-mentioned semiconductor manufacturing apparatus, reaction products are accumulated or deposited on the ceramic ring such that a thin film is formed. A force known as Maxell's stress is known to act on a dielectric present in an electrostatic field. When starting plasma discharge, the accumulated thin film of reaction products is placed in the electric field as described above, and Maxell's stress acts thereon under the effect of the dielectric constant or elastic modulus or a difference therebetween of the ceramic ring which is a dielectric. The thin film is broken and peels off, thus generating particles. The thus produced particles are positively charged as a result of collision of positive ions while the particles pass through the cathode sheath near the lower electrode.

On the surface of the semiconductor substrate, on the other hand, a negative self-bias potential spontaneously occurs as a result of a difference in mobility between electron and positive ion upon impressing the radio-frequency power. The particles positively charged in the cathode sheath are attracted by the semiconductor substrate having a negative self-bias potential under the effect of electrostatic force. This is considered to cause the motion of particles flying describing a parabola as mentioned above.

Referring to FIG. 17, it is confirmed that the particles having peeled off from the upper electrode are positively charged in the anode sheath, repelled by the bulk plasma, drop outside the plasma, and are attracted by the semiconductor substrate having a negative self-bias potential under the effect of action of the electrostatic force, at the moment when the plasma disappears along with discontinuance of processing.

DESCRIPTION OF PREFERRED EMBODIMENTS

Embodiments of the present invention will now be described on the basis of the aforementioned result of observation with reference to the drawings. Description will be made in detail by means of embodiments.

(First Embodiment)

Figure 1:
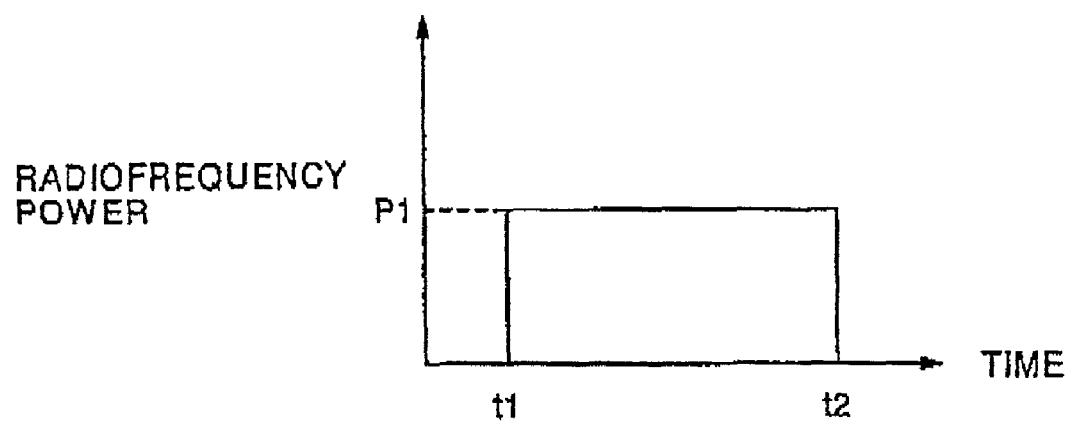
FIG. 1 illustrates changes with time in radio-frequency power in a case where processing is conducted by use of a plasma etcher in the existing manufacturing method of semiconductor devices.
Figure 2:
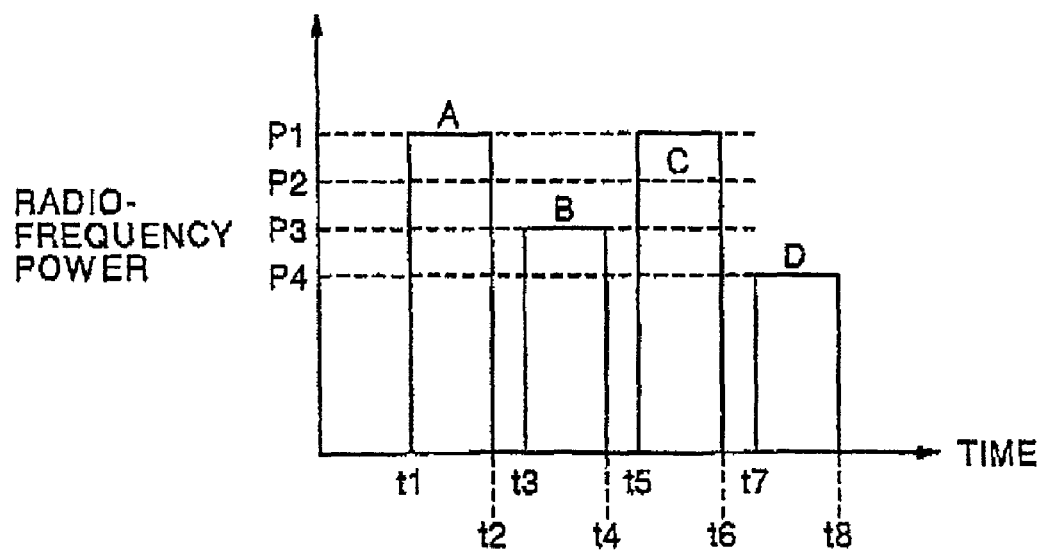
FIG. 2 illustrates change with time in radio-frequency power in a case where a plurality of processes through a plurality of successive steps by means of a plasma etcher in the existing manufacturing method of semiconductor devices.
Figure 3:
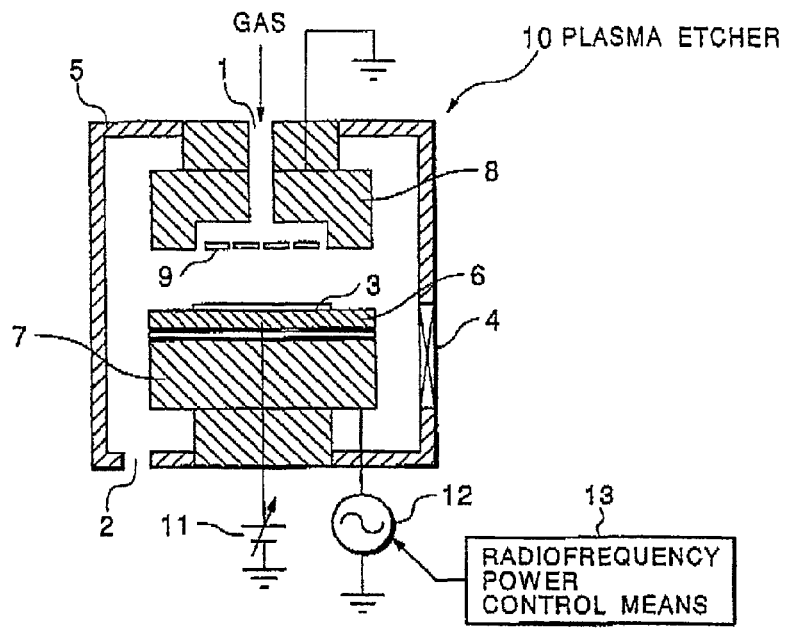
FIG. 3 illustrates the configuration of a plasma etcher used in the manufacturing method of semiconductor devices in a first embodiment of the present invention.

Description will be made of a first embodiment of this invention. Referring to FIG. 3, the plasma etcher 10 used for the implementation of the manufacturing method of semiconductor devices of this embodiment comprises an introducing port 1 of a plasma etching gas provided in the upper portion; a process chamber 5 having a gas outlet 2 provided in the lower portion and a gate valve 4 provided on a side for passing the semiconductor substrate 3 which is to be processed; a cathode 7, provided in the process chamber 5, for mounting the semiconductor substrate 3 via a stage 6 and an anode arranged oppositely to the cathode 7; a shower head 9 for guiding the gas to the cathode 7; an electrostatic chucking power source 11 connected to the stage 6; a radio-frequency source 12 connected to the cathode 7; and radio-frequency power control means 13 for controlling radio-frequency power output from the radio-frequency source 12 to become a desired power. The anode 8 is grounded. Aluminum (Al) excellent in heat conductivity and not discharging a detrimental substances such as a heavy metal is used for the process chamber 5.

The manufacturing method of semiconductor devices of this embodiment will now be described in the sequence of steps with reference to FIGS. 4 to 6. This embodiment will be described by means of a case of manufacturing a middle structure of wiring of a DRAM (dynamic random access memory).

Figure 5A:
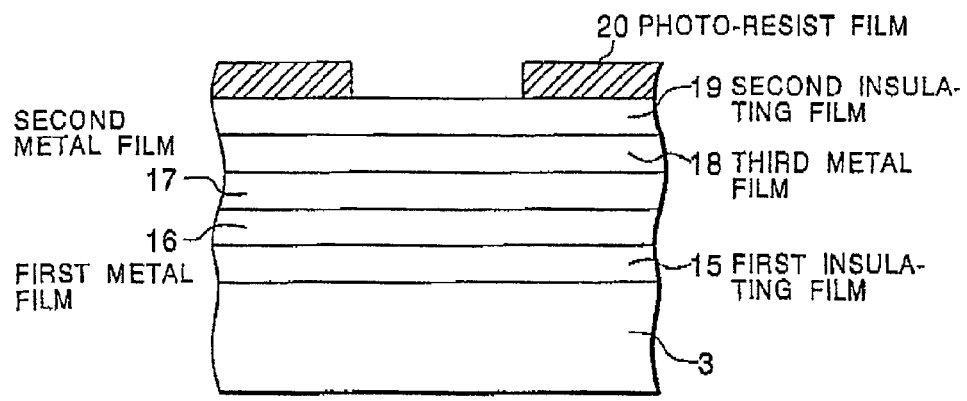
FIGS. 5A, 5B, and 5C illustrate process diagrams showing the manufacturing method of semiconductor devices of the invention in the sequence of steps.

As shown in FIG. 5A, a semiconductor substrate 3 is provided, having an insulating film 15 comprising a silicon oxide film, a first metal film 16 comprising a titanium (Ti) film, a second metal film 17 comprising a titanium nitride (TiN) film, a third metal film 18 comprising tungsten, and a second insulating film 19 comprising a silicon oxide film, sequentially formed thereon. The first and second metal films 16 and 17 are used for forming a barrier film, and the third metal film 18 serves to form a bear plug. Then, a photoresist film 20 is formed in an area not subjected to processing on the semiconductor substrate 3. Then, the semiconductor substrate 3 is placed on the stage 6 on the cathode 7 in the process chamber 5, and the semiconductor substrate 3 is attracted by the electrostatic adsorption source 11.

Figure 4:
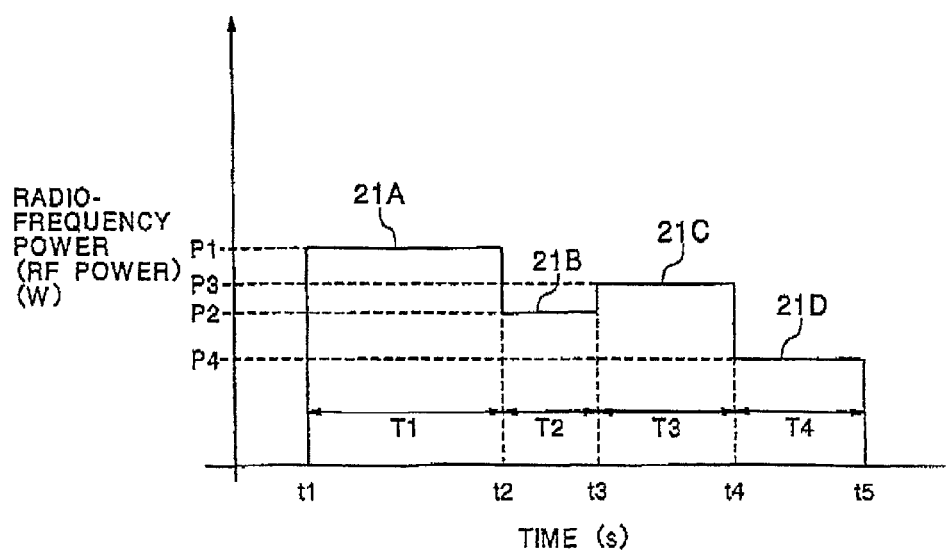
FIG. 4 illustrates changes with time in radio-frequency power in a case where a plurality of processes are carried out through a plurality of successive steps by means of the plasma etcher shown in FIG. 3.
Figure 5B:
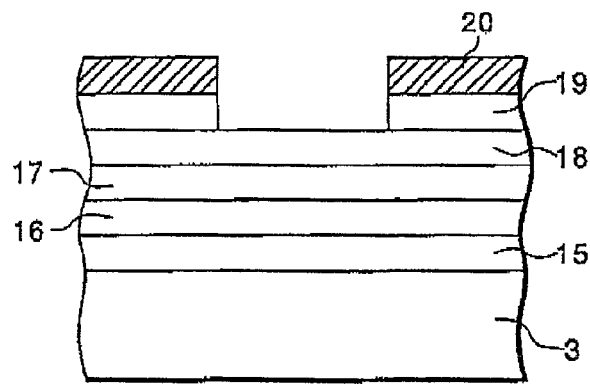

Then, as shown In FIG. 4, the radio-frequency power source 12 is controlled by the radio-frequency power control means 13 of the plasma etcher 10 to set a first step 21A for carrying out a first processing during a period from time t to time t2. For this first step 21A, for example, a radio-frequency power P1 of from 780 to 820 W, and a time T1 of from 55 to 65 seconds. Simultaneously with this, an etching gas such as $N_2$ is introduced through the introducing port 1 into the process chamber 5. As a result, as shown in FIG. 58, a second insulating film 19 is selectively etched with a photoresist film 20 as a mask, as a first processing in a first step 21A.

Then, as shown in FIG. 4, the radio-frequency power source 12 is controlled by the radio-frequency power control means 13 of the plasma etcher 10 to set a second step 21B for carrying out a second processing during a period from time t2 to time t3. For this second step 21B. for example, a radio-frequency power P2 of from 580 to 620 W. and a time T2 of from 18 to 22 seconds are set. Simultaneously with this, an etching gas such as a mixed gas of $N_2$ and $O_2$ is introduced through the introducing port 1 into the process chamber 5.

Figure 5C:
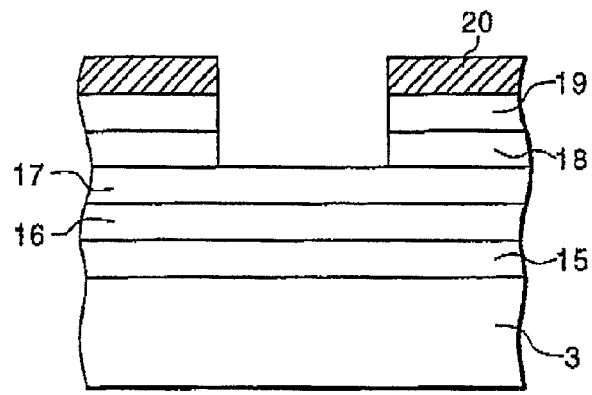
Figure 6A:
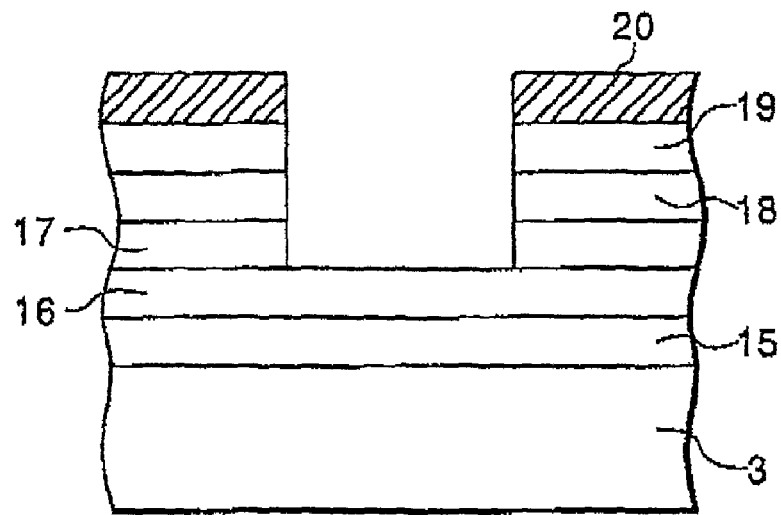
FIGS. 6A and 6B illustrate process diagrams showing the manufacturing method of semiconductor devices of the invention in the sequence of steps.
Figure 17:
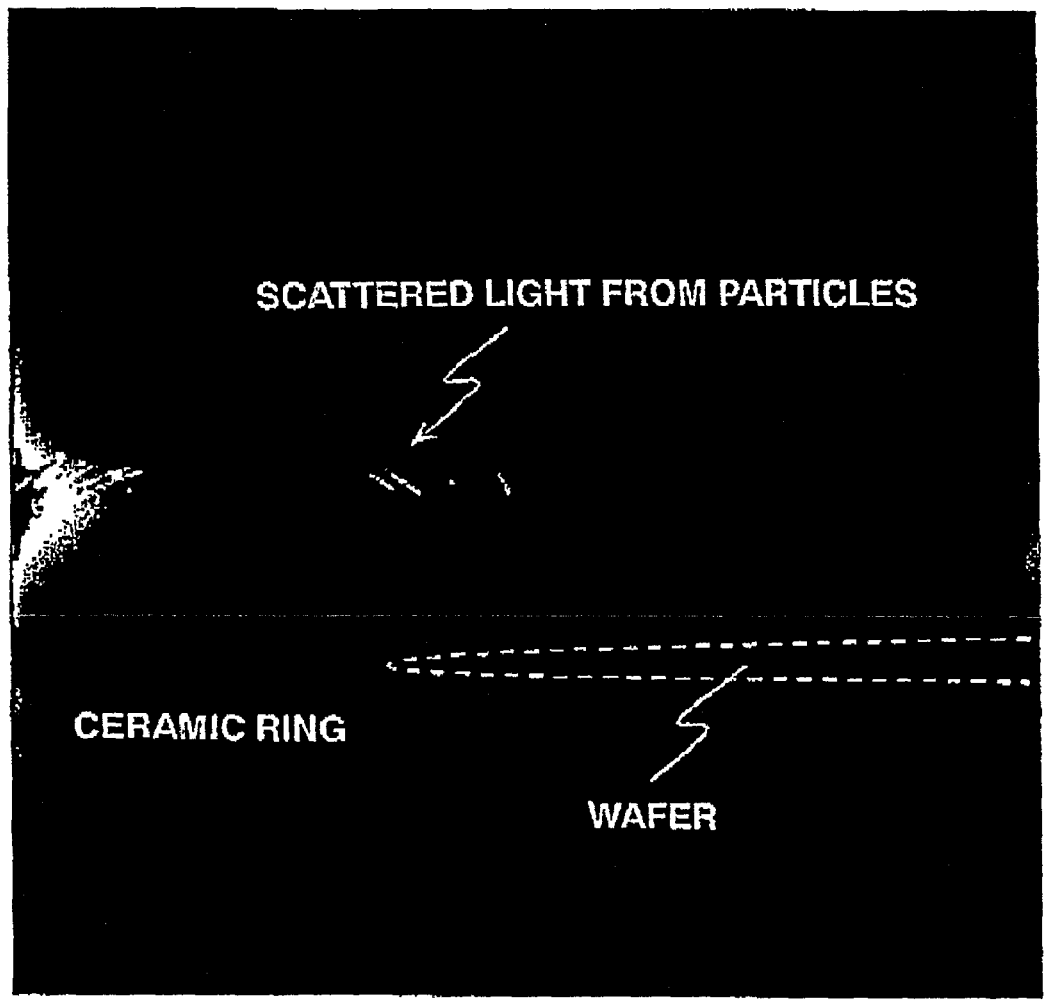
FIG. 17 illustrates the behavior of particles produced at a point in time immediately after discontinuing etching, as observed by means of the particle monitoring system shown in FIG. 14.

As a result, as shown in FIG. 5C, a third metal film 18 is selectively etched with a photoresist film 20 as a common mask, as a second processing in a second step 21B. Because transfer from the first step 21A to the second step 21B is continuously performed, the radio-frequency power never becomes 0 in steps in the middle, the extent of dropping of the particles in the process chamber 5 becomes very slight, as is known from the result of observation described with reference to FIG. 17, Since the change in the radio-frequency power becomes smaller in the interval between the first and second steps 21A and 21B, production of particles is also inhibited, Then, as shown in FIG. 4, the radio-frequency power source 12 is controlled by the radio-frequency power control means 13 of the plasma etcher 10 to set a third step 21C for carrying out a third processing during a period from time t3 to time t4. For this third step 21C, for example, a radio-frequency power P3 of from 640 to 660 W, and a time T3 of from 28 to 32 seconds are set. Simultaneously with this, an etching gas such as a mixed gas of $N_2$ and $O_2$ is introduced through the introducing port 1 into the process chamber 5. As a result, as shown in FIG. 6A, a second metal film 17 is selectively etched with a photoresist film 20 as a common mask, as a third processing in a third step 21C. Because transfer from the second step 21B to the third step is 21C continuously performed, the positively charged particles drop so as to avoid the positive plasma potential, and the extent of dropping of the particles in the process chamber 5 becomes very slight, as is known from the result of observation described above with reference to FIG. 17. Since the change in the radio-frequency power becomes smaller in the interval between the second and third steps 21B and 21C, production of particles is also inhibited.

Figure 6B:
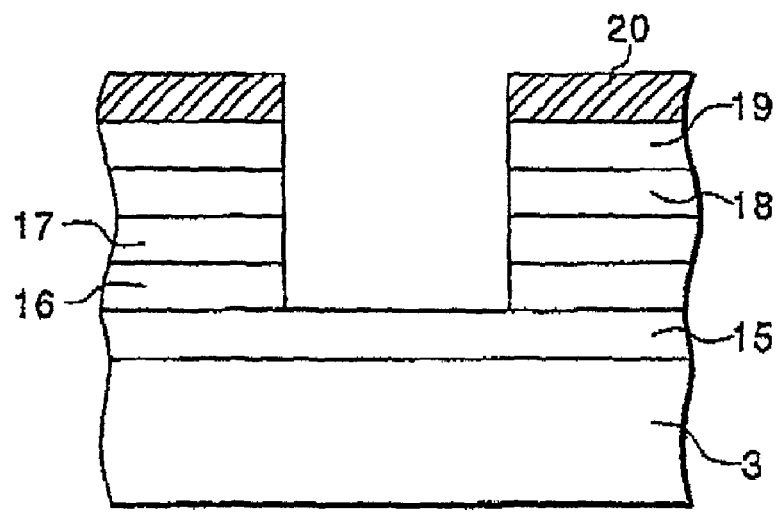

Then, as shown in FIG. 4, the radio-frequency power source 12 is controlled by the radio-frequency power control means 13 of the plasma etcher 10 to set a fourth step 21D for carrying out a fourth processing during a period of from t4 to time t5. For this fourth step 21D, for example, a radio-frequency power P4 of from 390 to 410 W, and a time T4 of from 28 to 32 seconds are set. Simultaneously with this, an etching gas such as $N_2$ is introduced through the introducing port 1 into the process chamber 5. As a result, as shown in FIG. 6B, a first metal film 16 is selectively etched with the photoresist film 20 as a common mask, as a fourth processing in a fourth step 21D.

A middle structure of DRAM wiring is manufactured through steps described above.

Because transfer from the third step 21C to the fourth step 21D is continuously performed, the positively charged particles drop so as to avoid the positive plasma potential, and the extent of dropping of the particles in the process chamber 5 becomes very slight, as is known from the result of observation described above with reference to FIG. 17. Since the change in the radio-frequency power becomes smaller in the interval between the third and fourth steps 21C and 21D, production of particles is also inhibited.

When conducting etching by use of the plasma etcher 10 having the process chamber 5 made of Al as described above, use of an etching gas containing fluoride (F) such as ($CF_4$) or ($SF_6$) is not desirable since it leads to easier formation of aluminum fluoride particles from a reaction between F and Al and resultant increase of particles present in the process chamber 5. It is therefore desirable to use an etching gas other than fluoride as is used in each processing in this embodiment. Applicable etching gases, other than nitrogen and oxygen shown above, include helium, neon, argon, krypton, xenon, radon and other inert elements, which bring about substantially the same advantages.

According to this embodiment, as described above, when applying the first to fourth processes while holding the semiconductor substrate 3 in the process chamber 5, the first to fourth processes are carried out through the first to fourth steps 21A to 21D in succession by switching over the level of radio-frequency power P1 to P4 in response to the individual processes. The plasma potential therefore never becomes 0 as a result of the radio-frequency power not becoming 0 in a step in the middle. The positively charged particles drop so as to avoid the positive plasma potential, so that the extent of dropping of the particles in the process chamber 5 becomes very slight.

When carrying out a plurality of processes by use of plasma through a plurality of successive steps, therefore, it is possible to inhibit occurrence of particles adhering to the semiconductor substrate and inhibit the number of particles, if produced, adhering to the semiconductor substrate.

(Second Embodiment)

Description will be made of a second embodiment of this invention.

Figure 7:
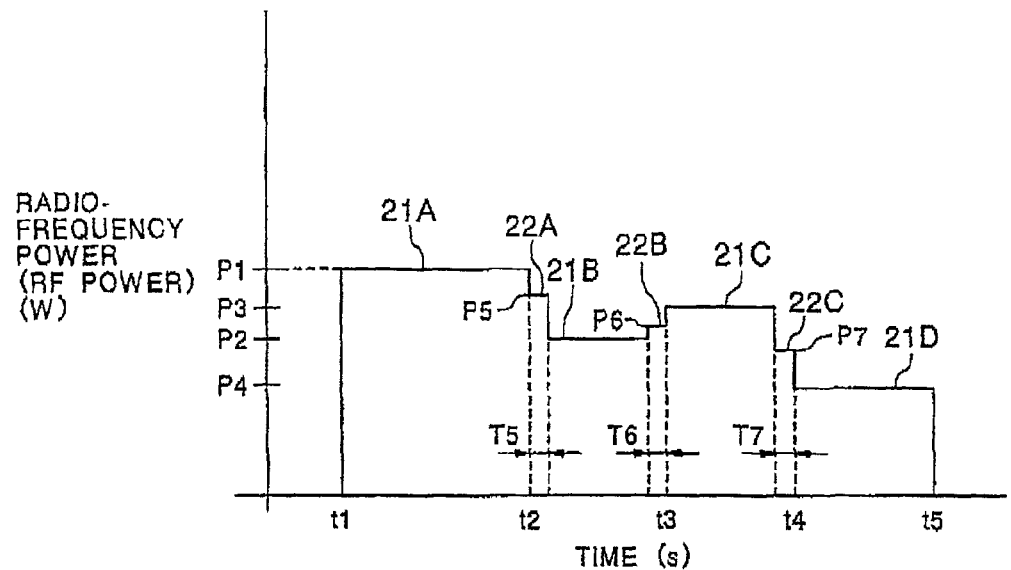
FIG. 7 illustrates changes with time in radio-frequency power in a case where a plurality of processes are carried out through a plurality of successive steps by means of the plasma etcher in the manufacturing method of semiconductor devices, which is a second embodiment of the invention.

FIG. 7 illustrates changes with time in radio-frequency power in a case where a plurality of processes are carried out through a plurality of successive steps by means of the plasma etcher in the manufacturing method of semiconductor devices, which is the second embodiment of the invention. The configuration of the manufacturing method of semiconductor devices in this embodiment is largely different from the configuration of the above-mentioned manufacturing method of semiconductor devices of the first embodiment in that an auxiliary step having an intermediate value of power between two adjacent steps is inserted between the two adjacent steps from among the plurality of steps.

In the manufacturing method of semiconductor devices of this embodiment, as shown in FIG. 7, in the first to fourth steps 21A to 21D corresponding to the first to fourth processes, a first auxiliary step 22A having an intermediate value of power P5 between power P1 of the first step 21A and power P2 of the second step 21B is inserted between the first step 21A and the second step 21B which adjacent to each other. A second auxiliary step 22B having an intermediate value of power P6 between power P2 of the second step 21B and power P3 of the third step 21C is inserted between the second step 21B and the third step 21C which are adjacent to each other. A third auxiliary step 22C having an intermediate value of power P7 between power P3 of the third step 21C and power P4 of the fourth step 21D is inserted between the third step 21C and the fourth step 21D which are adjacent to each other. For the first auxiliary step 22A, for example, a radio-frequency power P5 of from 680 to 720 W and a time T5 of from 1 to 5 seconds are set. For the second auxiliary step 22B, for example, a radio-frequency power P6 of from 620 to 630 W and a time T6 of from 1 to 5 seconds are set. For the third auxiliary step 22G, for example, a radio-frequency power P7 of from 500 to 550 W and a time T7 of from 1 to 5 seconds are set.

According to this embodiment, the auxiliary steps 22A to 22C having an intermediate value of radio-frequency power between the individual adjacent steps are inserted between the adjacent steps. Transfer between the steps can therefore be accomplished very accurately and continuously via the auxiliary steps 22A to 22C. This prevents loss of the balance between forces acting on the particles caused by a steep change in plasma potential, and thus, the extent of dropping of the particles in the process chamber 5 becomes smaller than in the first embodiment.

In this embodiment as well, there are available substantially the same advantages as those described in the first embodiment.

(Third Embodiment)

Description will be made of a third embodiment of this invention.

Figure 8:
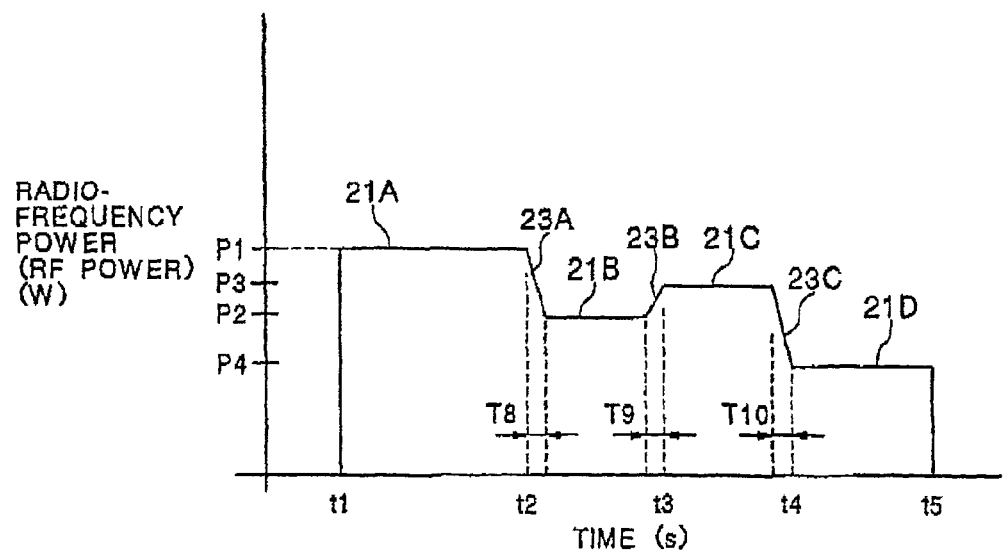
FIG. 8 Illustrates changes with time in radio-frequency power in a case where a plurality of processes are carried out through a plurality of successive steps by means of the plasma etcher in the manufacturing method of semiconductor devices, which is a third embodiment of the invention.

FIG. 8 illustrates changes with time in radio-frequency power in a case where a plurality of processes are carried out through a plurality of successive steps by means of the plasma etcher in the manufacturing method of semiconductor devices, which is a third embodiment of the invention. The configuration of the manufacturing method of semiconductor devices of this embodiment is largely different from the above-mentioned configuration of the manufacturing method of semiconductor devices of the first embodiment in that an auxiliary step in which the level of power slowly changes between levels of power of two adjacent steps is inserted between the two adjacent steps from among the plurality of steps.

In the manufacturing method of semiconductor devices of this embodiment, as shown in FIG. 8, in the first to fourth steps 21A to 21D corresponding to the first to fourth processes, a first auxiliary step 23A in which the level of power slowly changes between power P1 of the first step 21A and power P2 of the second step 21B is inserted between the first step 21A and the second step 21B which are adjacent to each other. A second auxiliary step 23B in which the level of power slowly changes between power P2 of the second step and power P3 of the third step is inserted between the second step 21B and the third step 21C which are adjacent to each other. A third auxiliary step 23C in which the level of power slowly changes between power P3 of the third step 21C and power P4 of the fourth step 21D is inserted between the third step 21C and the fourth step 21D which are adjacent to each other. For the first to third auxiliary steps 23A to 23C, times T8 to T10 of from 1 to 5 seconds are set.

According to this embodiment, auxiliary steps 23A to 23C in which the level of power slowly changes between the radio-frequency power values of the individual steps are inserted between two adjacent steps, respectively. Transfer between the steps can therefore be accomplished very accurately and continuously via the auxiliary step 23A to 23C. This prevents loss of the balance between forces acting on the particles caused by a steep change in plasma potential, and thus, the extent of dropping of the particles in the process chamber 5 becomes smaller than in the first embodiment.

In this embodiment as well, there are available substantially the same advantages as those described in the first embodiment.

(Fourth Embodiment)

Description will be made of a fourth embodiment of this invention.

Figure 9:
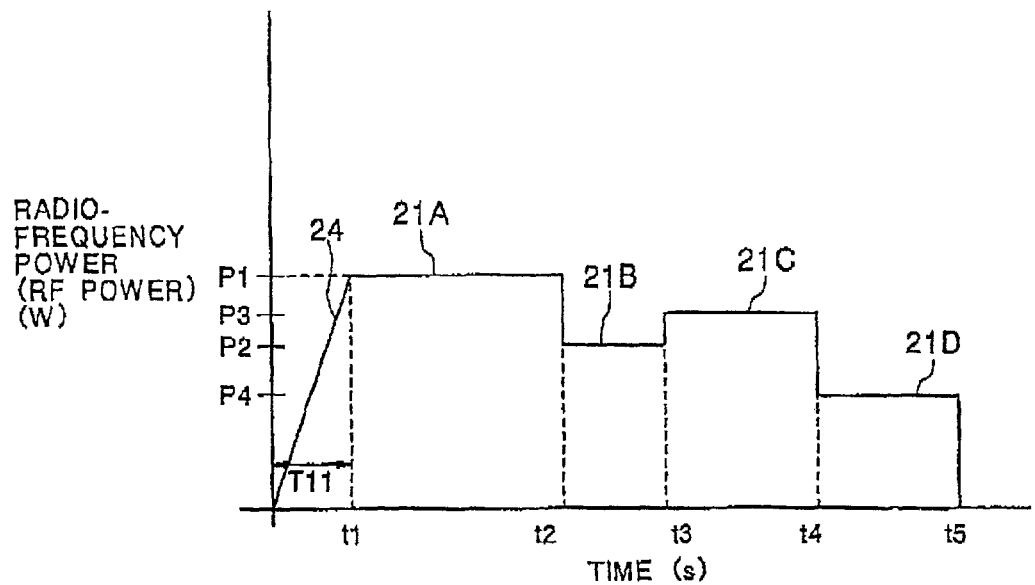
FIG. 9 illustrates changes with time in radio-frequency power in a case where a plurality of processes are carried out through a plurality of successive steps by means of the plasma etcher in the manufacturing method of semiconductor devices, which is a fourth embodiment of the invention.

FIG. 9 illustrates changes with time in radio-frequency power in a case where a plurality of processes are carried out through a plurality of successive steps by means of the plasma etcher in the manufacturing method of semiconductor devices, which is a fourth embodiment of the invention. The configuration of the manufacturing method of semiconductor devices of this embodiment is largely different from that of the manufacturing method of semiconductor devices of the first embodiment in that an auxiliary step in which the level of power slowly increases between 0 and the power in the first step is inserted before the first step from among the plurality of steps.

Figure 16:
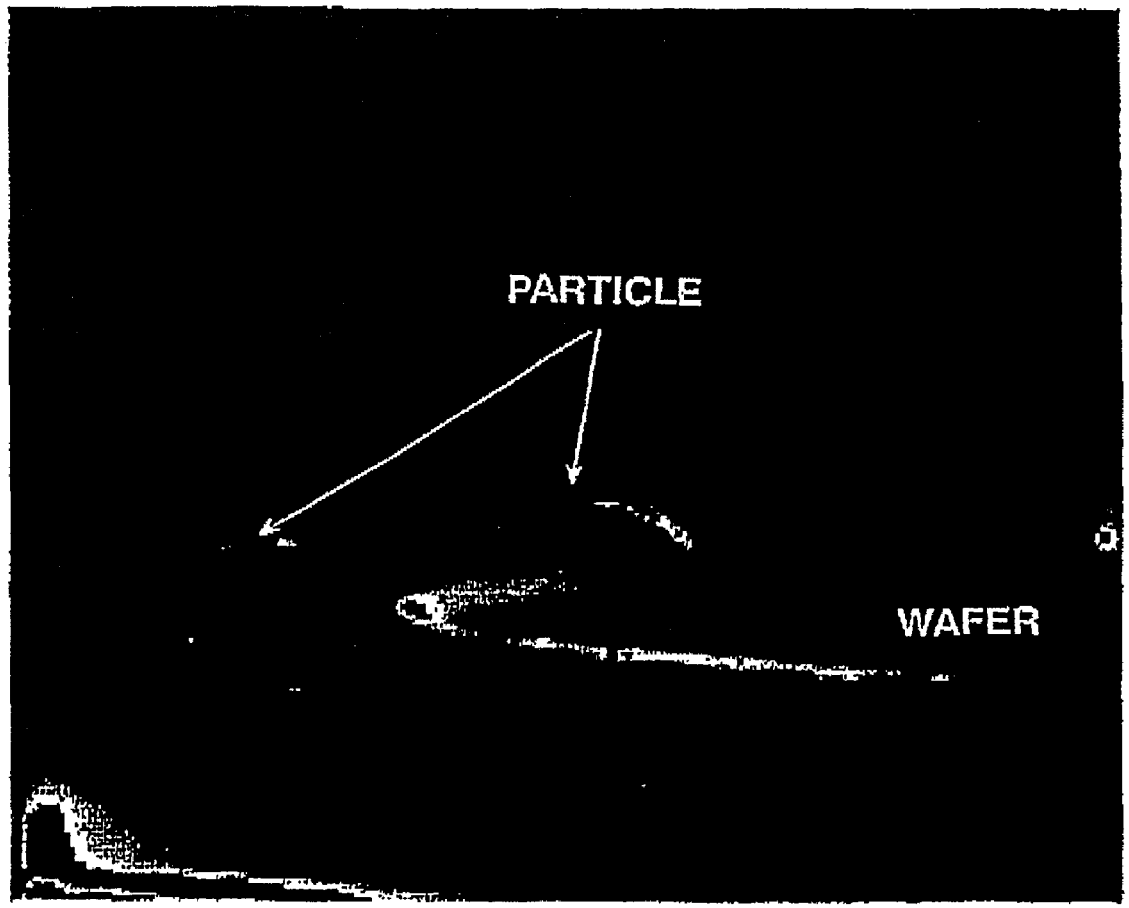
FIG. 16 illustrates the behavior of particles produced at a point in time immediately after starting etching, as observed by means of the particle monitoring system shown in FIG. 14.

As shown in FIG. 9, in the manufacturing method of semiconductor devices of this embodiment, the auxiliary step 24 in which the level of power slowly increases between 0 and power P1 of the first step 21A is inserted before the first step 21A corresponding to the first processing. For the auxiliary step 24, a time T11 of from 20 to 30 seconds is set, According to this embodiment, the auxiliary step 24 in which the level of power slowly increases between 0 and power P1 of the first step 21A is inserted before the first step 21A. As is known from the result of observation described above with reference to FIG. 16, it is possible to prevent particularly the particles coming flying from the periphery of the semiconductor substrate from adhering to the semiconductor substrate.

According to the aforementioned result of observation, more specifically, Maxell's stress acts on the thin film on the grounded insulator around the semiconductor substrate at the start of impression of the radio-frequency power of the first step, and the stripped thin film becoming particles which jump up. It is therefore possible to prevent peeling by achieving a slow change in stress acting on the thin film through insertion of the auxiliary step 24 of which the power changes slowly as described above, and to inhibit occurrence of particles.

In this embodiment as well, there are available substantially the same advantages as those described in the first embodiment.

In addition, according to the configuration of this embodiment, it is possible particularly to prevent adherence of the particles which jump from the periphery of the semiconductor substrate from adhering to the semiconductor substrate.

(Fifth Embodiment)

Figure 10:
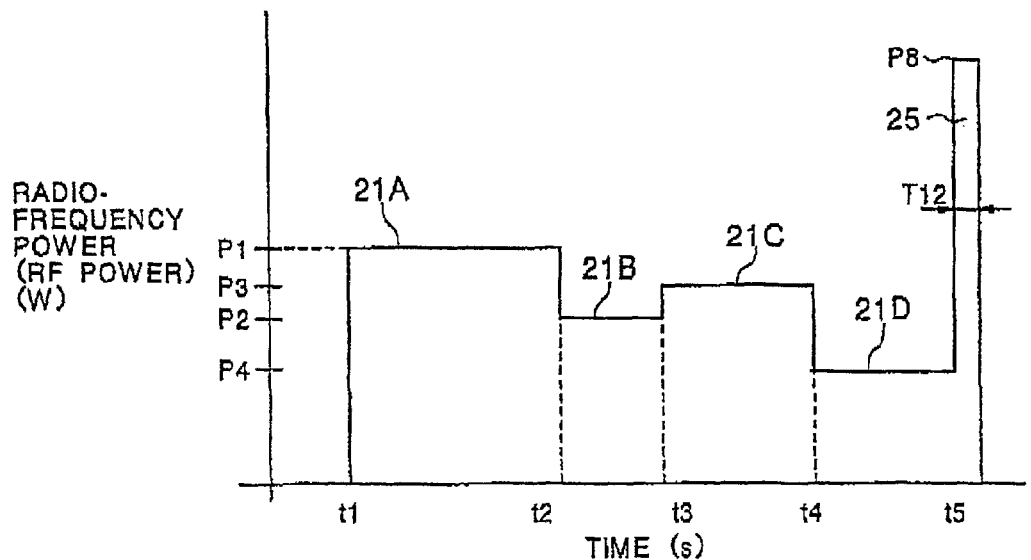
FIG. 10 illustrates changes with time in radio-frequency power in a case where a plurality of processes are carried out through a plurality of successive steps by means of the plasma etcher in the manufacturing method of semiconductor devices, which is a fifth embodiment of the invention.

Description will be made of a fifth embodiment of this invention. FIG. 10 illustrates changes with time in radio-frequency power in a case where a plurality of processes are carried out through a plurality of successive steps by means of the plasma etcher in the manufacturing method of semiconductor devices, which is a fifth embodiment of the invention. The configuraton of the manufacturing method of semiconductor devices of this embodiment is largely different from the abovementioned configuration of the manufacturing method of semiconductor devices of the fourth embodiment in that an auxiliary step of which the level of power increases over the power of the final step is inserted after the final step from among the plurality of steps.

As shown in FIG. 10, in the manufacturing method of semiconductor devices of this embodiment, a step 25 of which the level of power increases over power P4 of the fourth step 21D, the final step, is inserted after the fourth step 21D corresponding to the fourth processing. A power P8 of from 900 to 1,100 W and a time T12 of from 1 to 5 seconds are set for the auxiliary step 25.

According to this embodiment, the auxiliary step 25 of which the level of power increases over power P4 of the fourth step 21D is inserted after the final fourth step 21D. It is therefore possible to repel the particles to the periphery particularly prior to discontinuing discharge, as is known from the result of observation described above with reference to FIG. 17. As a result, it is possible to prevent the particles produced in a large quantity at the end of discharge from adhering to the semiconductor substrate.

More specifically, the plasma potential VP shown in FIG. 10 increases according as the level of power becomes higher. In the auxiliary step 25, therefore, the positively charged stripped particles are exposed to a larger electrostatic reaction by a positive plasma potential. The particles fly at a higher speed toward the process chamber wall while being confined in the sheath area. On the periphery of the plasma as well, the positively charged particles receive reaction by a high plasma potential. The particles drop without being directed toward a semiconductor substrate and discharged together with the gas. By inserting the auxiliary step 25 with an increased power, it is possible to easily exclude the particles.

According to this embodiment, as described above, it is possible to prevent particles produced in a large quantity upon discontinuing discharge from adhering to the semiconductor substrate.

(Sixth Embodiment)

Description will be made of a sixth embodiment of this invention.

Figure 11:
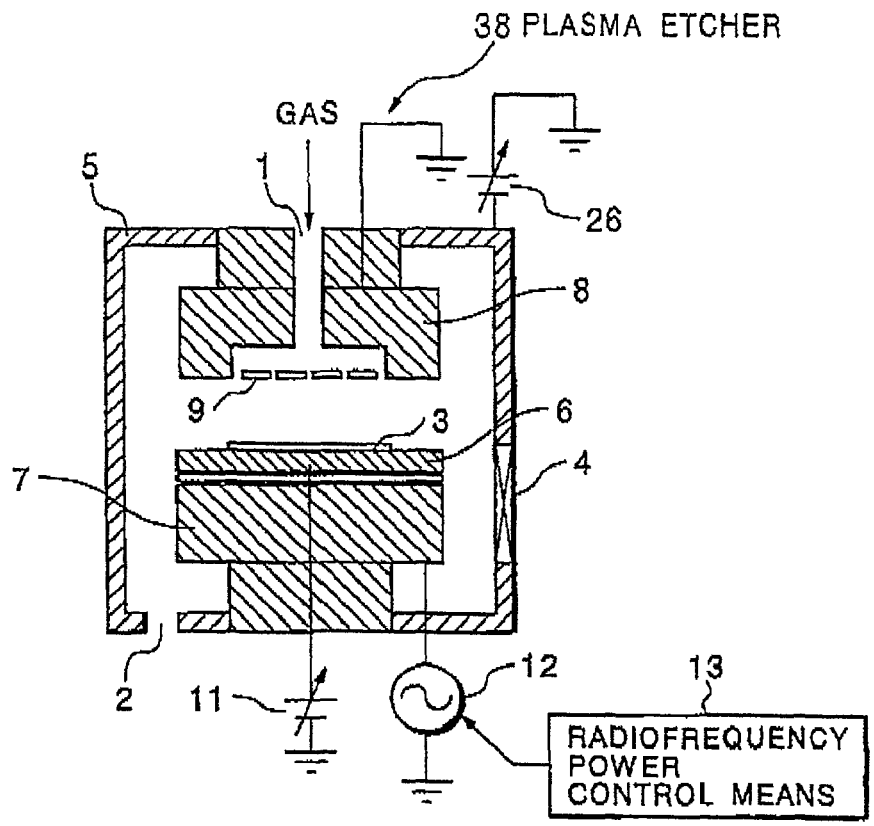
FIG. 11 illustrates the configuration of a plasma etcher, which is a sixth embodiment of the invention.

FIG. 11 illustrates the configuration of a plasma etcher, which is a sixth embodiment of the invention. The configuration of the plasma etcher of this sixth embodiment is largely different from that of the aforementioned first embodiment in that a negative potential is given to the process chamber.

In the plasma etcher 38 of this embodiment, as shown in FIG. 11, a negative power supply 26 is connected to the process chamber 5 for the purpose of achieving a larger potential difference between the process chamber 5 and the bulk plasma. By adopting such a configuration, it is possible to confine particles produced in the process chamber 5 within a plasma sheath, and hence to prevent the particles from adhering to the semiconductor substrate. The sixth embodiment has the same configuration as that shown in FIG. 3 described above in the first embodiment except the above. A detailed description is therefore omitted. The reason will now be described with reference to FIG. 12.

Figure 12:
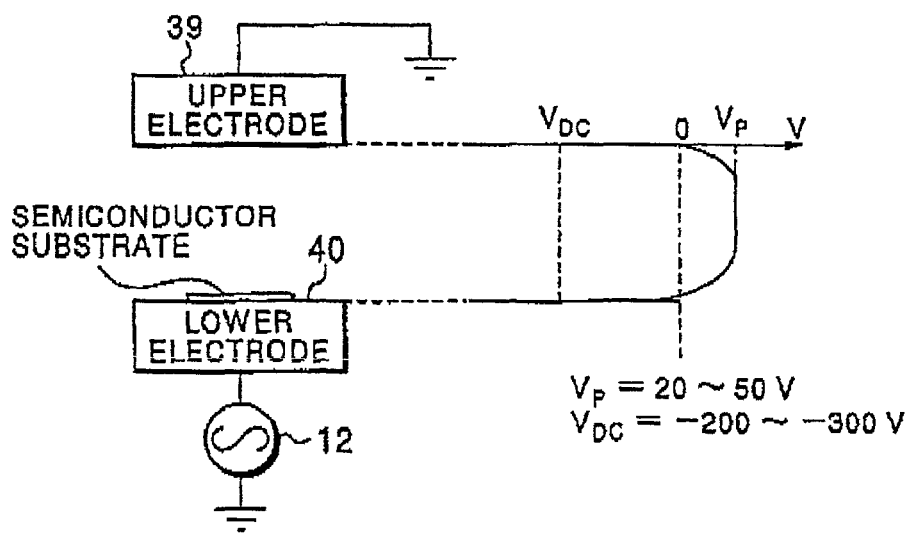
FIG. 12 schematically illustrates the electrostatic potential distribution in the vertical direction during plasma generation in a general semiconductor manufacturing apparatus using plasma.

As shown in FIG. 12, the electrostatic potential distribution in the vertical direction during generation of plasma is such that the plasma region between the upper electrode 39 and the lower electrode 40 has a positive plasma potential VP; and grounded upper electrode 39 has a potential of 0; and the lower electrode to which the radio-frequency power supply 11 is connected has a negative potential. Under process conditions commonly adopted, the semiconductor substrate surface on the lower electrode 40 has a self-bias potential VDC within a range of from −200 to −300 V. Regarding the electrostatic potential distribution in the horizontal direction, on the other hand, a semiconductor manufacturing apparatus using a usual plasma has a potential of 0 by grounding the plasma chamber 5.

As shown in FIG. 11, the potential difference from the positive plasma potential VP becomes larger by impressing a negative potential onto the plasma chamber wall 5. More specifically, this achieves a stronger electric field of a sheath area between the plasma chamber wall 5 and the plasma region, so that it becomes difficult for the positively charged particles dropping through this sheath region to enter the plasma region, thus permitting confinement of particles in the sheath.

According to this embodiment, as described above, it is possible to confine the particles in the plasma sheath, and hence to prevent the particles from adhering to the semiconductor substrate.

(Seventh Embodiment)

Description will be made of a seventh embodiment of this invention.

Figure 13:
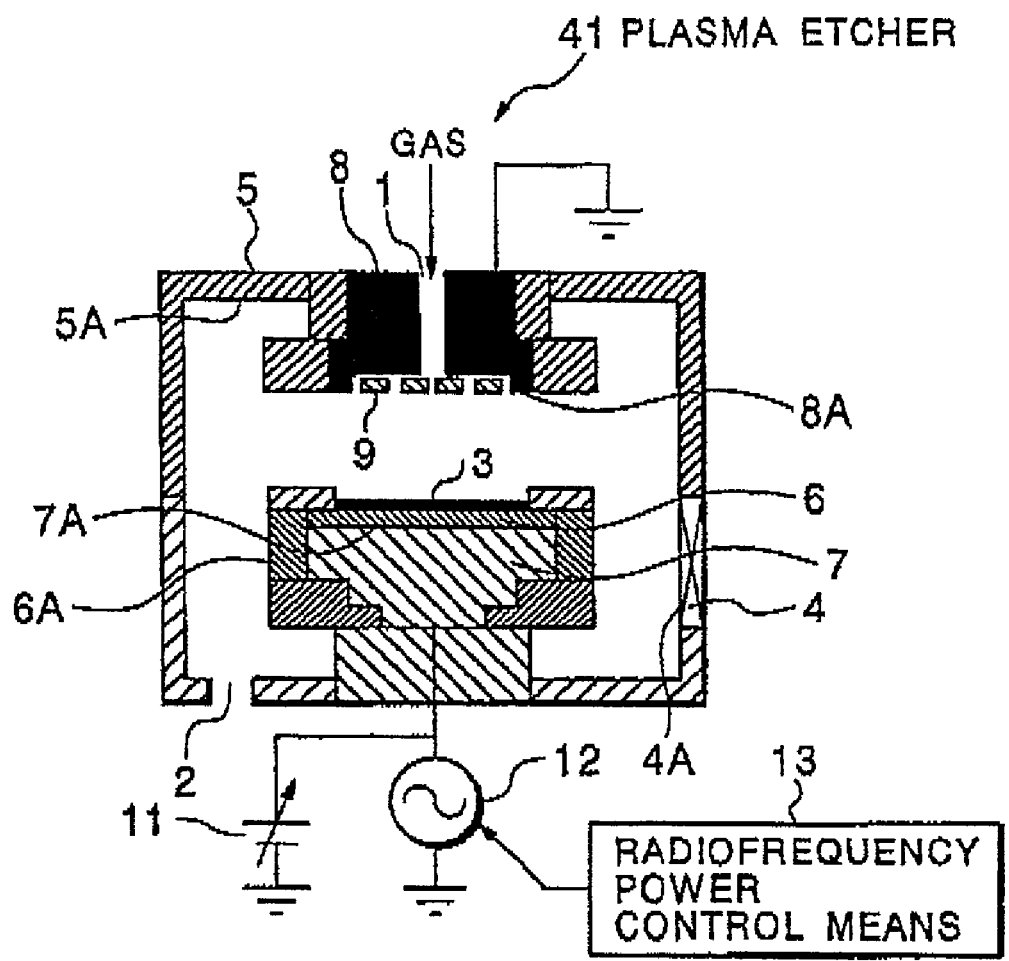
FIG. 13 illustrates the configuration of the plasma etcher, which is a seventh embodiment of the invention.
Figure 14:
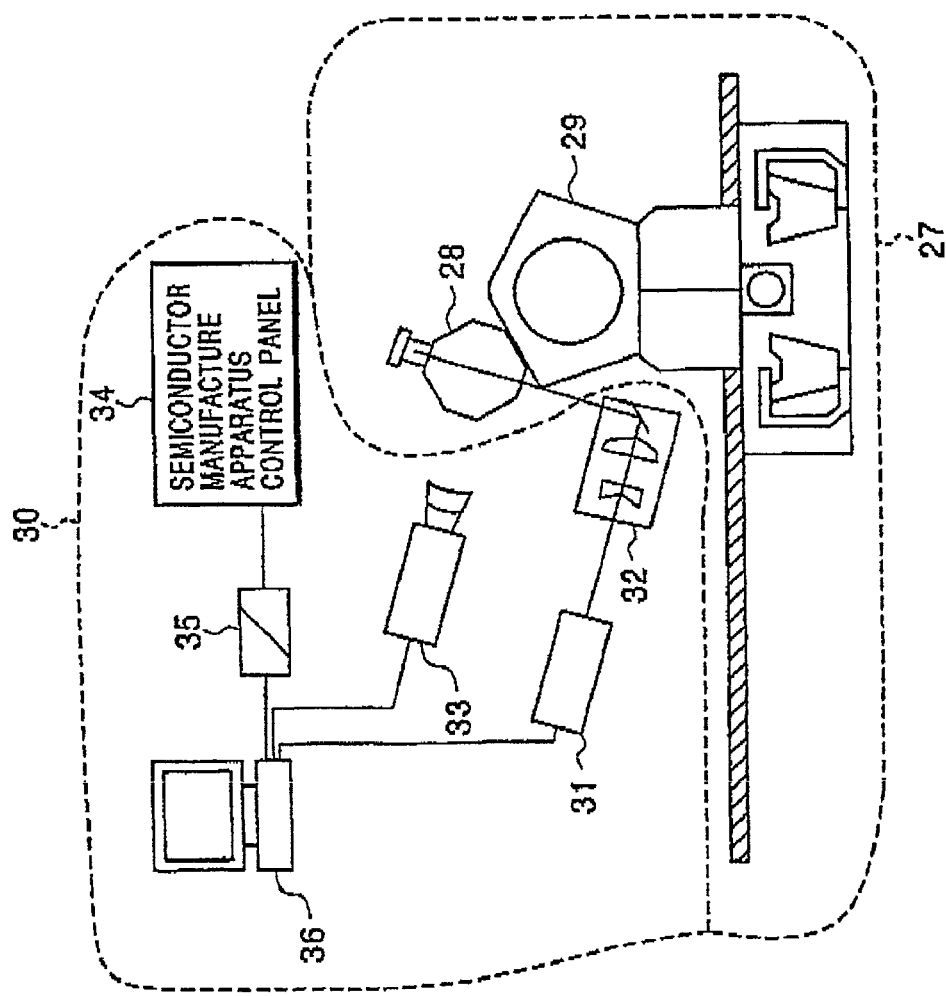
FIG. 14 schematically illustrates the configuration of the particle monitoring system used for observation of particles forming a prerequisite for the invention.
Figure 15:
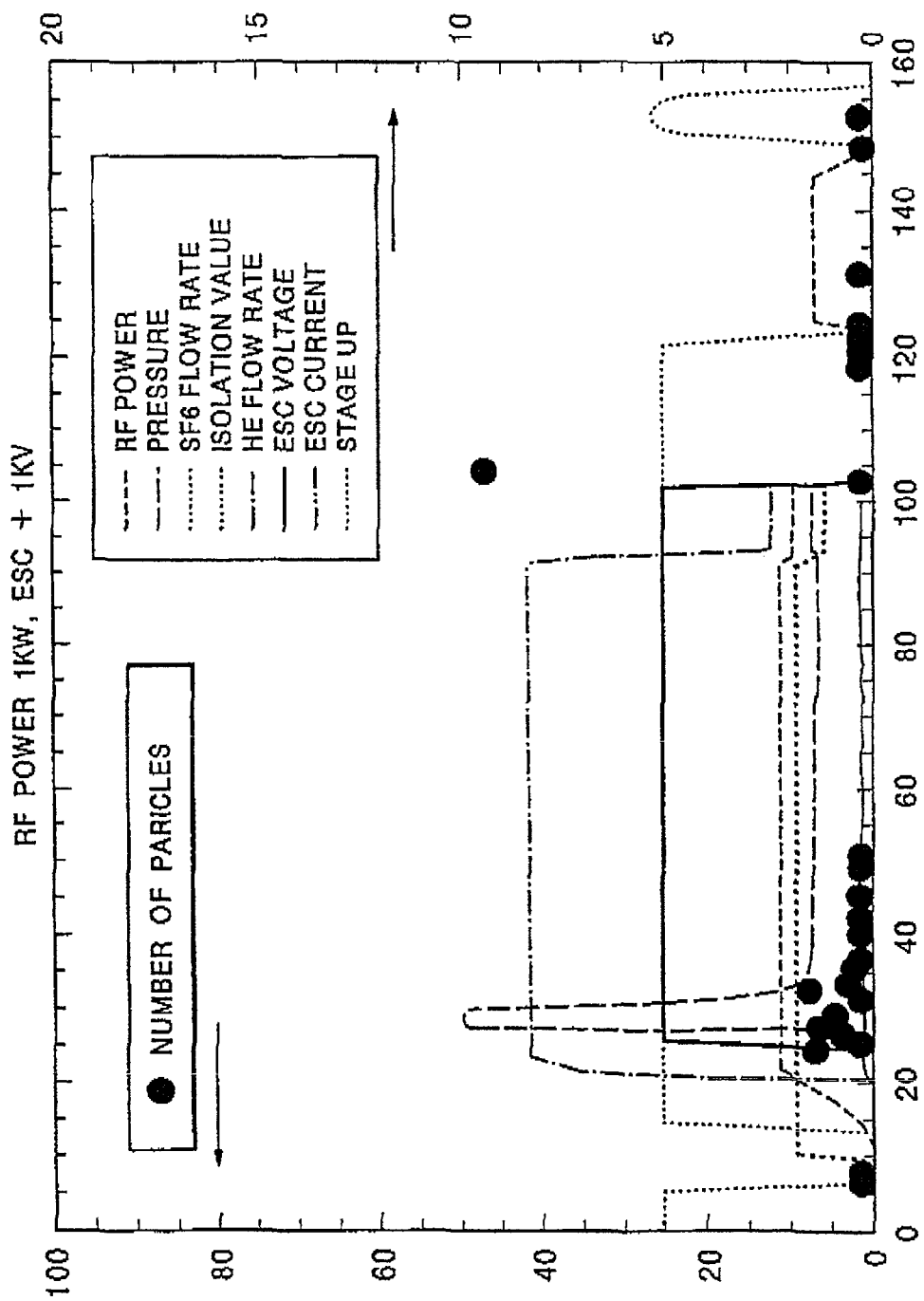
FIG. 15 illustrates the relationship between various parameters (ordinate) and time (abscissa) in a case where a particle monitoring system shown in FIG. 14 is operated.

FIG. 13 illustrates the configuration of the plasma etcher, which is a seventh embodiment of the invention. The configuration of the plasma etcher of the seventh embodiment is largely different from the configuration of the aforementioned first embodiment in that the component parts used in the plasma etcher are made of a material having a dielectric constant close to that of the reaction products accumulated in the process chamber.

In the plasma etcher of this embodiment 41 as shown in FIG. 13, 1 component parts such as a surface portion 4A of the gate valve 4 used in the plasma etcher 41, a wall surface portion 5A of the process chamber 5, a peripheral portion 6A of the stage 6, a surface portion 7A of the cathode 7, and a surface portion 8A of the anode 8 are made of a material having a dielectric constant close to that of the reaction products accumulated in the process chamber 5. For example, in a case where the reaction product such as resist containing carbon is easily accumulated, the upper component parts are made of molten quartz. This permits prevention of peeling of the accumulated reaction product film, and hence to reduce occurrence of particles. The reason will now be described.

The force F acting per unit volume of a dielectric present in an electric field is expressed by the following formula according to "Electromagnetology Theory of Phenomena" (by S. Takeyama, Aug. 20, 1975, published by Maruzen Co., Ltd., p.130):

$$F = \rho E - (1/2)E^2 \, grad \, \in + (1/2) grad((CE^2 m(d \in /dm))$$

where, $\rho$: true electric charge density,
E: electric field,
$\in$: dielectric constant,
m: mass density.

Because transfer of the true electric charge is slight in genera, application of the above formula to the plasma etcher reveals that the force F largely depends upon the second term $[(1/2)E^2 \, grad \in]$ and the third term $[(1/2) \, grad \, ((E^2 m \, (d \, \epsilon/dm))]$ in the above formula.

In the above formula, the second term represents the force acting on the dielectric when an electric field exists at a place where the dielectric constant varies, i.e., a force acting on the portion between the inner parts of the process chamber and the reaction product film accumulated thereon in a sheath formed near the upper electrode and the lower electrode around the plasma, or near the process chamber wall. A small change in dielectric constant, that is, if a small difference in dielectric constant between the inner parts of the process chamber and the reaction product leads to a small value of the second term, resulting in a smaller force acting on the reaction product film, and it becomes more difficult for the reaction product to peel off or to be broken. The component parts to be made of a material having a dielectric constant close to that of the reaction product are limited to the component parts around the semiconductor substrate to be processed in view of the occurring condition of particles. This measure taken only for the periphery 6A of the stage 6 and the surface portion 8A of the anode 8 is well effective.

In this embodiment as well, there are available substantially the same advantages as those described in the first embodiment.

(Eighth Embodiment)

Description will be made of an eighth embodiment of this invention.

The configuration of the plasma etcher of the eighth embodiment of the invention is largely different from the configuration of the above-mentioned seventh embodiment in that the component parts used in the plasma etcher are made of a material having an elastic modulus close to that of the reaction products accumulated in the process chamber.

In the plasma etcher of this embodiment having substantially the same configuration as that shown in FIG. 13, the component parts including the surface portion 4A of the gate valve 4 used in the plasma etcher, the wall surface portion 5A of the process chamber 5, the peripheral portion 6A of the stage 6, the surface portion 7A of the cathode 7 and the surface portion 8A of the anode 8 are made of a material having an elastic modulus close to that of the reaction products accumulated in the process chamber 5. By adopting this configuration, it is possible to prevent peeling of the reaction product film accumulated on the component parts, and hence to reduce occurrence of particles. The reason thereof will be described in the following paragraphs.

As described above as to the plasma etcher of the seventh embodiment, transfer of true electric charge is slight in general in a plasma etcher. Therefore, the abovementioned force F largely depends upon the second term $[(1/2)E^2 grad \in]$ and the third term $[(1/2) \, grad \, ((E^2 m \, (d \in /dm))]$ in the above formula.

In the formula, the third term represents the force produced when there is an electric field at a place where the dielectric constant varies, together with the mass density while the dielectric suffers from a strain under the effect of the force. The magnitude of the force is dependent upon the difference in elastic modulus between parts in the chamber and the reaction products. If the difference in elastic modulus between the parts in the process chamber and the reaction products is small, the third term becomes smaller. The force acting on the reaction product film therefore becomes smaller, making it more difficult for the reaction product film to peel off or to be broken.

In this embodiment as well, as described above, there are available substantially the same advantages as those described in the seventh embodiment.

The embodiments of the present invention have been described above in detail with reference to the drawings. Detailed configurations are not however limited to these embodiments, but design variants within a range not deviating from the spirit of the invention are within the scope of the present invention. For example, a plasma etcher has been explained as an example of the plasma generator, but it is not limited to this, but the invention is applicable to any of the other plasma generators such as a plasma CVD apparatus or a plasma sputtering apparatus. A case of forming a DRAM wiring has been described as a manufacturing method of semiconductor devices. This is not however limitative, but the invention is applicable to any processing of a thin film comprising an insulating film or a conductive film, or a semiconductor substrate itself into a desired shape. Numerical values of radio-frequency power and values of impressing time shown in the embodiments are only examples, and may be appropriately changed in response to the purpose of uses.

As a variant of the sixth, seventh and eighth embodiments, a negative power supply may be connected to a liner detachably attached in the interior of the process chamber for the purpose of facilitating maintenance. Since this liner, like the process chamber, is made usually of aluminum, almost the same advantages as in the case of direct connection of the negative power supply to the process chamber. As a variant of the seventh and eighth embodiments, the component part used in the plasma etcher may be made of a material having a dielectric constant and an elastic modulus close to those of the reaction products accumulated in the process chamber, providing substantially the same advantages as those available in the seventh and eighth embodiments. Apart from single application of the individual embodiments, they may be implemented in the form of an appropriate combination. This synergetically provide the inhibiting effect of adhesion of particles produced in the process chamber to the semiconductor substrate.

According to the manufacturing method of semiconductor devices of the present invention, as described above, when conducting a plurality of processes while holding the semiconductor substrate in the process chamber, these processes are carried out through a plurality of successive steps by switching over the level of radio-frequency power in response to each processing. The radio-frequency power never becomes 0 during processing steps, thus achieving a very slight extent of dropping of the particles in the process chamber.

When carrying out a plurality of processes through a plurality of successive steps by use of plasma, therefore, it is possible to inhibit occurrence of particles adhering to the semiconductor substrate, or even if particles are produced, it is possible to inhibit the number of particles adhering to the semiconductor substrate, thus reducing the adverse effect of the particles.

While this invention has thus far been disclosed in conjunction with several embodiments thereof, it will be readily possible for those skilled in the art to put this invention into practice in various other manners.

What is claimed is:

1. A semiconductor manufacturing apparatus, comprising:
a process chamber having a conductive inner wall defining a reaction room;
a cathode which mounts a semiconductor substrate to be processed in said process chamber;
an anode electrode which is arranged oppositely to the cathode in said process chamber, said semiconductor substrate being subjected to a desired processing by introducing a process gas into said process chamber, and plasma being generated in said process chamber through impression of a radio-frequency power onto said cathode;
a radio-frequency power control unit which impresses a radio-frequency power onto said cathode by switching over a level of the radio-frequency power in response to each of a plurality of processing steps while holding said semiconductor substrate in said process chamber; and
a power supply connected to the process chamber and configured to supply a potential to the conductive inner wall, with said potential configured to be negative to the potential of said anode electrode, during a plasma-processing operation in which said semiconductor substrate is processed, so that the reaction room is defined by the potential-supplied conductive inner wall.

2. An apparatus as claimed in claim 1, wherein:
said power supply is a negative power supply to supply a non-oscillating negative potential to the conductive inner wall.

3. A semiconductor manufacturing apparatus, comprising:
a chamber in which plasma is generated to process a semiconductor substrate mounted in said chamber, said chamber having a conductive inner wall which defines a reaction room;
a cathode provided in said chamber for mounting the semiconductor substrate;
an anode arranged oppositely to said cathode; and
a voltage generator connected to said chamber and configured to supply a non-oscillating potential to said conductive inner wall, with said non-oscillating potential being negative to the potential of said anode, during a plasma-processing operation in which said semiconductor substrate is processed, so that said reaction room is defined by the potential-supplied conductive wall.

4. The apparatus as claimed in claim 3, wherein said voltage generator supplies a negative potential to said conductive inner wall.

5. A semiconductor manufacturing apparatus, comprising:
a process chamber;
an introducing port for a plasma etching gas provided in the process chamber;
a cathode provided in the process chamber for mounting the semiconductor substrate;
an anode arranged oppositely to the cathode and grounded; and
a power supply connected to the process chamber and configured for attaching a non-oscillating negative potential, during a plasma-processing operation in which said semiconductor substrate is processed, to the horizontal and vertical walls of the process chamber.

6. The apparatus of claim 5, wherein the power supply applies a negative potential to the process chamber sufficient to confine positive particles, produced in the process chamber, within a plasma sheath.

7. The apparatus of claim 6, further comprising:
a radio-frequency power control unit which impresses a radio-frequency power onto said cathode by switching over a level of the radio-frequency power in response to each of a plurality of processing steps while holding said semiconductor substrate in said process chamber, and
wherein the power supply applies a negative potential to the process chamber sufficient to prevent the particles from adhering to the semiconductor substrate.

8. A semiconductor manufacturing apparatus, comprising:
a process chamber;
a cathode which mounts a semiconductor substrate to be processed in said process chamber;
an anode electrode which is grounded and arranged oppositely to the cathode in said process chamber, said semiconductor substrate being subjected to a desired processing by introducing a process gas into said process chamber, and plasma being generated in said process chamber through impression of a radio-frequency power onto said cathode;
a radio-frequency power control unit which impresses a radio-frequency power onto said cathode by switching over a level of the radio-frequency power in response to each of a plurality of processing steps while holding said semiconductor substrate in said process chamber; and
a negative power supply connected to the process chamber and configured for attaching a negative potential to the process chamber to provide a potential difference, during a plasma-processing operation in which said semiconductor substrate is processed, between the horizontal and vertical walls of the process chamber and a bulk plasma within the process chamber.

9. An apparatus as claimed in claim 8, wherein the negative power supply imparts a non-oscillating potential difference between said process chamber and the bulk plasma formed in said process chamber to such an extent as to prevent particles present in said process chamber from adhering to said semiconductor substrate.

10. A semiconductor manufacturing apparatus, comprising:
a chamber in which plasma is generated to process a semiconductor substrate mounted in said chamber;
a cathode provided in said chamber for mounting the semiconductor substrate;
an anode arranged oppositely to said cathode; and
a voltage generator configured for imparting a non-oscillating potential difference, during a plasma-processing operation in which said semiconductor substrate is processed, between horizontal walls of said chamber and said plasma, said voltage generator connected to said chamber, with the potential of said chamber being negative to the potential of said anode.

11. The apparatus as claimed in claim 10, wherein said voltage generator imparts a negative potential to said horizontal walls of said chamber.

12. The apparatus as claimed in claim 10, wherein said voltage generator is connected to impart the potential to the horizontal walls and to the vertical walls of said chamber.

13. The apparatus of claim 1, wherein, the power supply connected to the process chamber is configured to supply said potential to the conductive inner wall, with said potential configured to be negative to the potential of said anode electrode, during a plasma-processing operation in which said semiconductor substrate is processed and prior to any CVD process ending, so that the reaction room is defined by the potential-supplied conductive inner wall.

* * * * *